(12) United States Patent
Hsu

(10) Patent No.: US 9,557,782 B2
(45) Date of Patent: Jan. 31, 2017

(54) SLIDE TRACK WITH A POSITIONING EFFECT

(71) Applicant: Kunshan Lemtech Slide Technology Co., Ltd., Kunshan, Jiangsu Province (CN)

(72) Inventor: Chi-Feng Hsu, New Taipei (TW)

(73) Assignee: Kunshan Lemtech Slide Technology Co., Ltd., Kunshan, Jiangsu Province (CN)

( * ) Notice: Subject to any disclaimer, the term of this patent is extended or adjusted under 35 U.S.C. 154(b) by 0 days.

(21) Appl. No.: 14/735,201

(22) Filed: Jun. 10, 2015

(65) Prior Publication Data
US 2016/0363965 A1    Dec. 15, 2016

(51) Int. Cl.
| | | |
|---|---|---|
| A47B 88/00 | (2006.01) | |
| G06F 1/18 | (2006.01) | |
| F16C 29/02 | (2006.01) | |
| H05K 7/14 | (2006.01) | |

(52) U.S. Cl.
CPC .............. G06F 1/182 (2013.01); F16C 29/02 (2013.01); H05K 7/1489 (2013.01)

(58) Field of Classification Search
CPC .................. A47B 88/0418; A47B 2088/0422; A47B 2088/0429; A47B 2088/0425; A47B 2088/0437; H05K 7/1489
USPC .................... 312/334.7, 330.1, 334.4, 223.1, 312/265.1–265.4; 384/22, 21; 361/725–727
See application file for complete search history.

(56) References Cited

U.S. PATENT DOCUMENTS

| | | | | |
|---|---|---|---|---|
| 6,601,933 B1 * | 8/2003 | Greenwald | ............ | A47B 88/08 312/330.1 |
| 7,967,399 B1 * | 6/2011 | Baiza | ................. | A47B 88/0422 312/223.1 |
| 8,118,267 B2 * | 2/2012 | Yu | ........................ | H05K 7/1489 248/222.11 |
| 8,366,217 B1 * | 2/2013 | Chen | .................... | A47B 88/044 312/333 |
| 8,585,166 B2 * | 11/2013 | Chen | ...................... | A47B 88/10 312/333 |
| 8,690,271 B1 * | 4/2014 | Chang | ................ | A47B 88/0422 248/298.1 |

(Continued)

FOREIGN PATENT DOCUMENTS

| | | | |
|---|---|---|---|
| JP | 3176461 | * | 6/2012 |
| JP | 3180814 | * | 1/2013 |

*Primary Examiner* — Janet M Wilkens
(74) *Attorney, Agent, or Firm* — Alan D. Kamrath; Kamrath IP Lawfirm, P.A.

(57) ABSTRACT

A slide track includes a slide track includes an inner track and a positioning member. The inner track includes a limiting groove and two positioning holes spaced from the limiting groove. The inner track further includes a hollow portion. The positioning holes are located between the limiting groove and the hollow portion. The positioning member further includes a stop portion and a pressing portion respectively extending away from two opposite sides of a base. The base includes two opposite faces between the stop portion and the pressing portion. A connection portion is formed on each opposite face of the base. A positioning portion is connected to each connection portion. Each positioning portion is positioned in one of the positioning holes of the inner track. The pressing portion is aligned with the hollow portion of the inner track. The stop portion is aligned with the limiting groove of the inner track.

6 Claims, 13 Drawing Sheets

(56) References Cited

U.S. PATENT DOCUMENTS

| | | | |
|---|---|---|---|
| 2009/0169140 A1* | 7/2009 | Chen | A47B 88/10 384/21 |
| 2011/0017894 A1* | 1/2011 | Yu | H05K 7/1489 248/309.1 |
| 2011/0024592 A1* | 2/2011 | Yu | H05K 7/1418 248/309.1 |
| 2012/0321230 A1* | 12/2012 | Chen | A47B 88/0418 384/41 |

* cited by examiner

SLIDE TRACK WITH A POSITIONING EFFECT

BACKGROUND OF THE INVENTION

The present invention relates to a slide track with a positioning effect and, more particularly, to a slide track including an inner track and a positioning member assembled with the inner track by snap-fitting.

In installation of a server of a rack-mounted computer server system to a slide track, an engagement button on a side of the server is inserted downwards into and, thus, engages in an engagement groove of the slide track, and a positioning member on the slide track positions the engagement button to prevent the engagement button from disengaging from the engagement groove.

However, the positioning member is generally connected to the slide track by riveting or screwing, which is troublesome. Furthermore, in use of the positioning member, the positioning member deforms to permit passage of the engagement button, and the engagement button is positioned after passing through the positioning member, leading to the risk of damage to the positioning member. Furthermore, replacement of the positioning member is not easy when the positioning member is riveted or screwed to the track.

Thus, a need exists for a novel slide track overcoming the problems and disadvantages of the prior art.

BRIEF SUMMARY OF THE INVENTION

The primary objective of the present invention is to provide a slide track including an inner track and a positioning member assembled to the inner track by snap-fitting to simply the assemblage of the positioning member and the inner track, reducing the manufacturing costs while permitting easy replacement of the positioning member.

The above objective is fulfilled by a slide track including a slide track includes an inner track and a positioning member. The inner track includes a limiting groove and two positioning holes spaced from the limiting groove in a longitudinal direction of the inner track. The two positioning holes are spaced from each other in a direction perpendicular to the longitudinal direction. The inner track further includes a hollow portion. The two positioning holes are located between the limiting groove and the hollow portion in the longitudinal direction. The positioning member has a base. The positioning member further includes a stop portion and a pressing portion respectively extending away from two opposite sides of the base. The base includes two opposite faces between the stop portion and the pressing portion. A connection portion is formed on each of the two opposite faces of the base. A positioning portion is connected to each connection portion. Each positioning portion is positioned in one of the two positioning holes of the inner track. The pressing portion is aligned with the hollow portion of the inner track. The stop portion is aligned with the limiting groove of the inner track.

The base of the positioning member can include a slot having a side. A resilient arm extends from the side of the slot and has a distal end outside of the slot of the base of the positioning member. The inner track further includes a pressing portion between the two positioning holes. The resilient arm abuts the pressing portion.

The slide track can further include a restraining hole defined in a side of each of the two positioning holes of the inner track distant to the hollow portion. Each restraining hole includes an inner wall having a limiting protrusion. A stop extends from a side of each positioning portion of the positioning member. Each positioning portion includes an outer face having a guiding groove. Each positioning portion extends into one of the two positioning holes of the inner track and moves towards one of the restraining holes when the positioning member is being mounted to the inner track. After each positioning portion enters one of the restraining holes, each limiting protrusion is received in one of the guiding grooves, and each stop abuts against and is positioned by an inner wall of one of the two positioning holes.

The positioning member can further include a bend between the base and the stop portion. The stop portion is located between the base and an inner face of the inner track.

The stop portion of the positioning member can further include an inclined guiding face facing an inner face of the inner track.

The positioning member can be integrally formed of plastic material by injection molding.

The present invention will become clearer in light of the following detailed description of illustrative embodiments of this invention described in connection with the drawings.

DETAILED DESCRIPTION OF THE INVENTION

Figure 1:
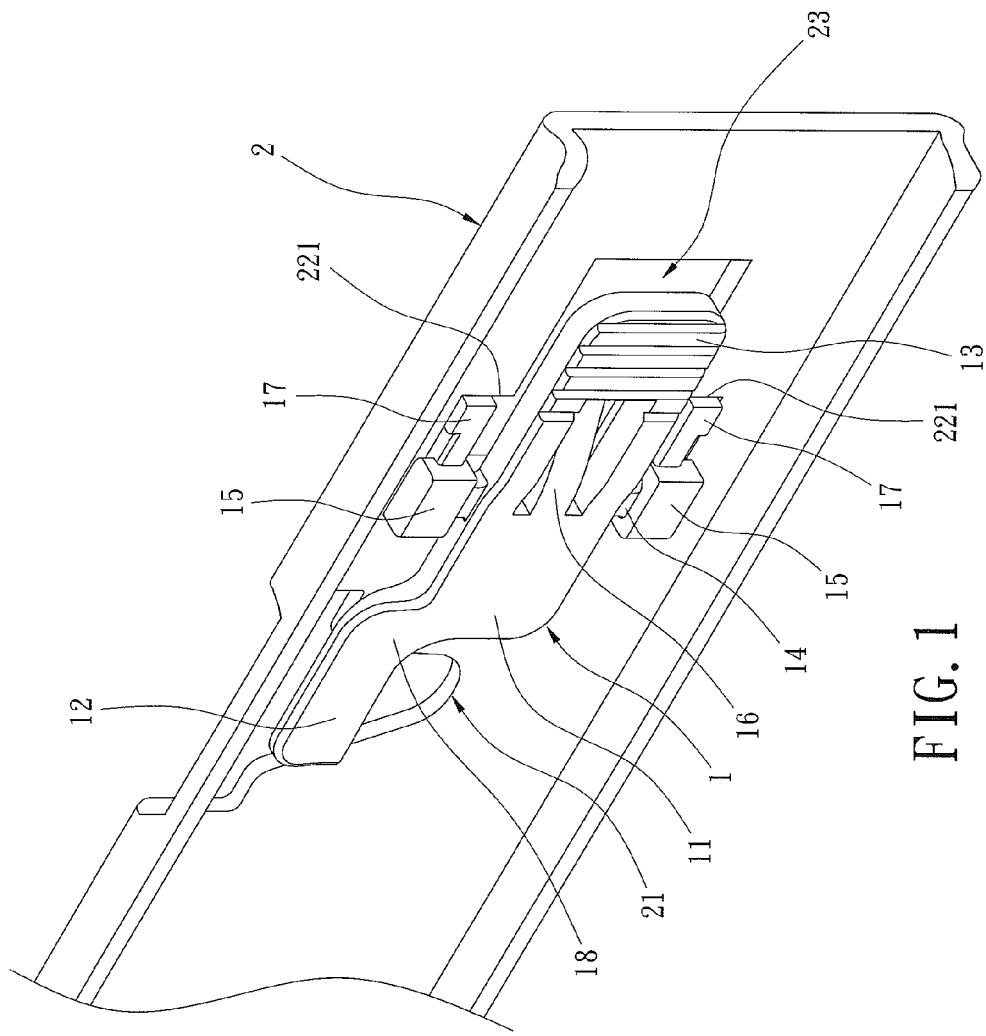
FIG. 1 is a perspective view of a slide track according to the present invention.
Figure 2:
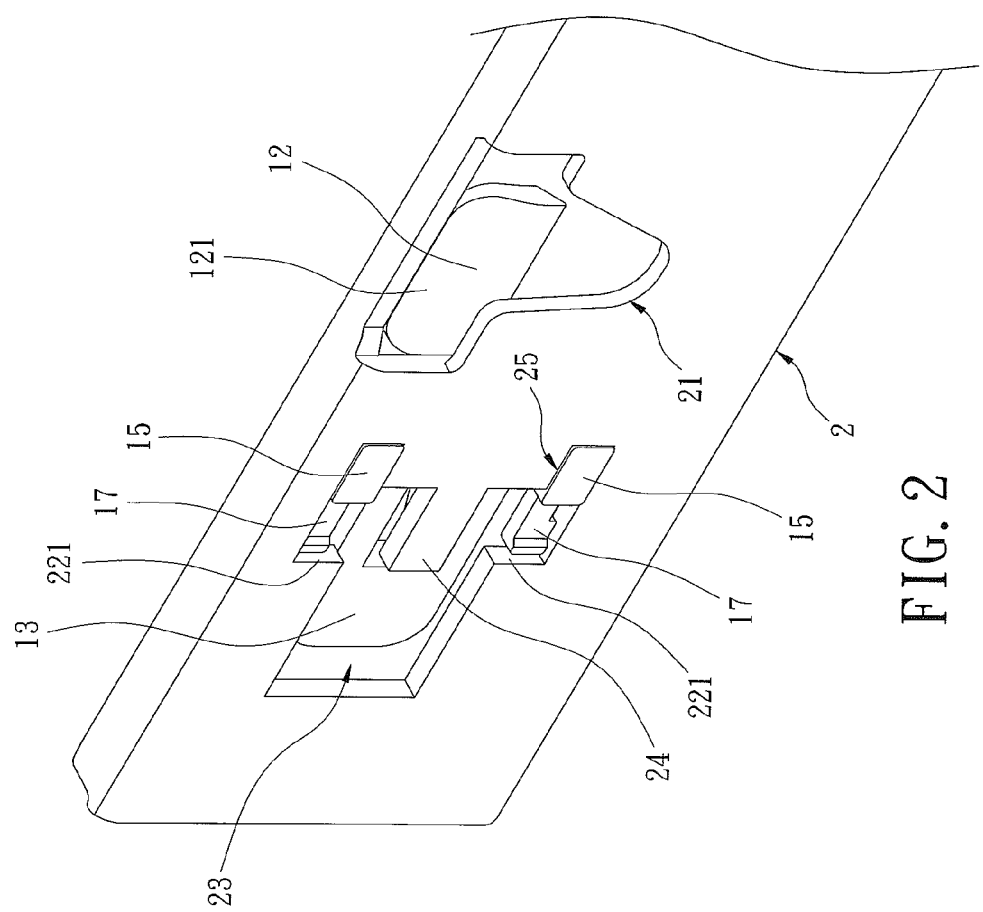
FIG. 2 is another perspective view of the slide track of FIG. 1.
Figure 3:
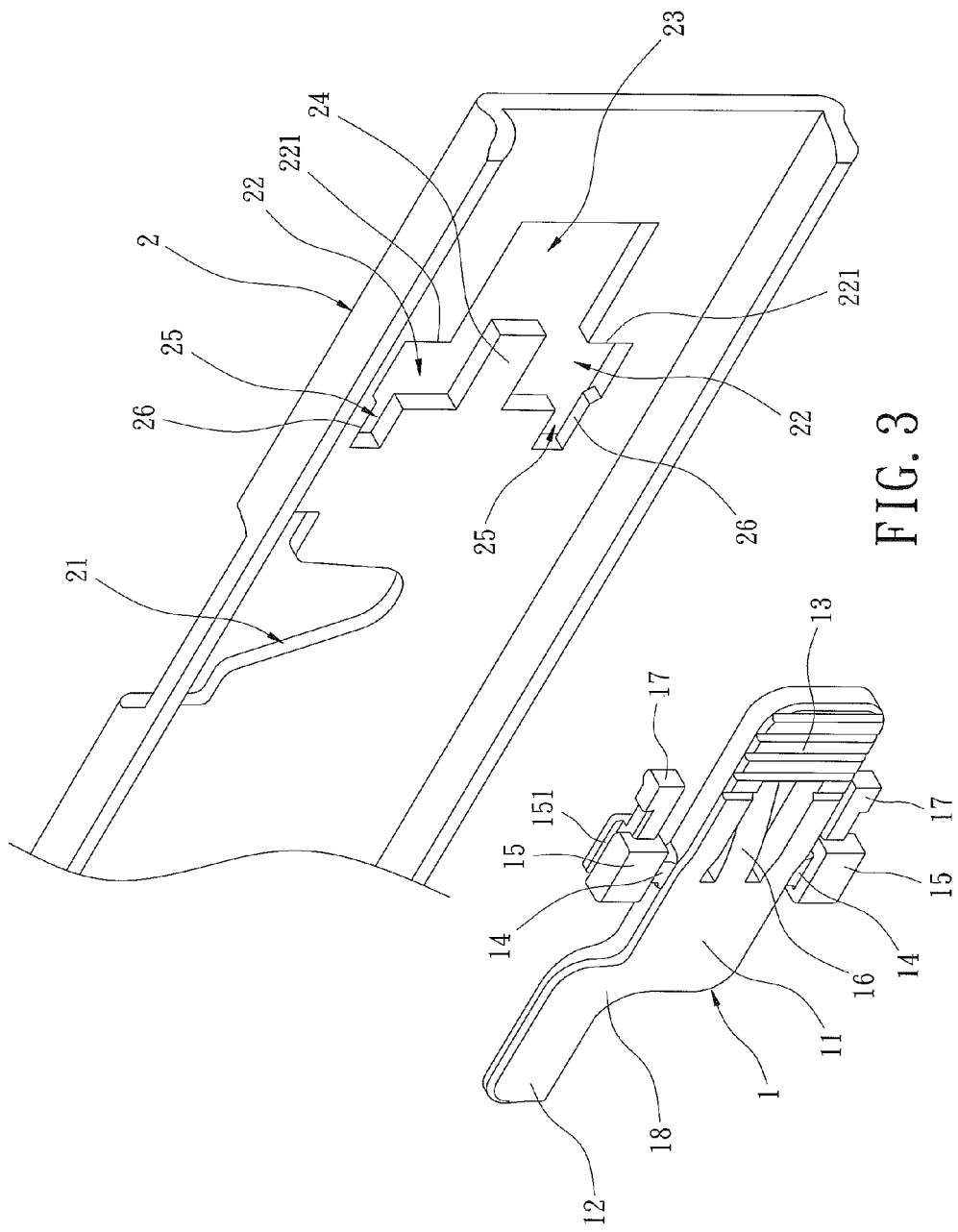
FIG. 3 is an exploded, perspective view of the slide track of FIG. 1.
Figure 4:
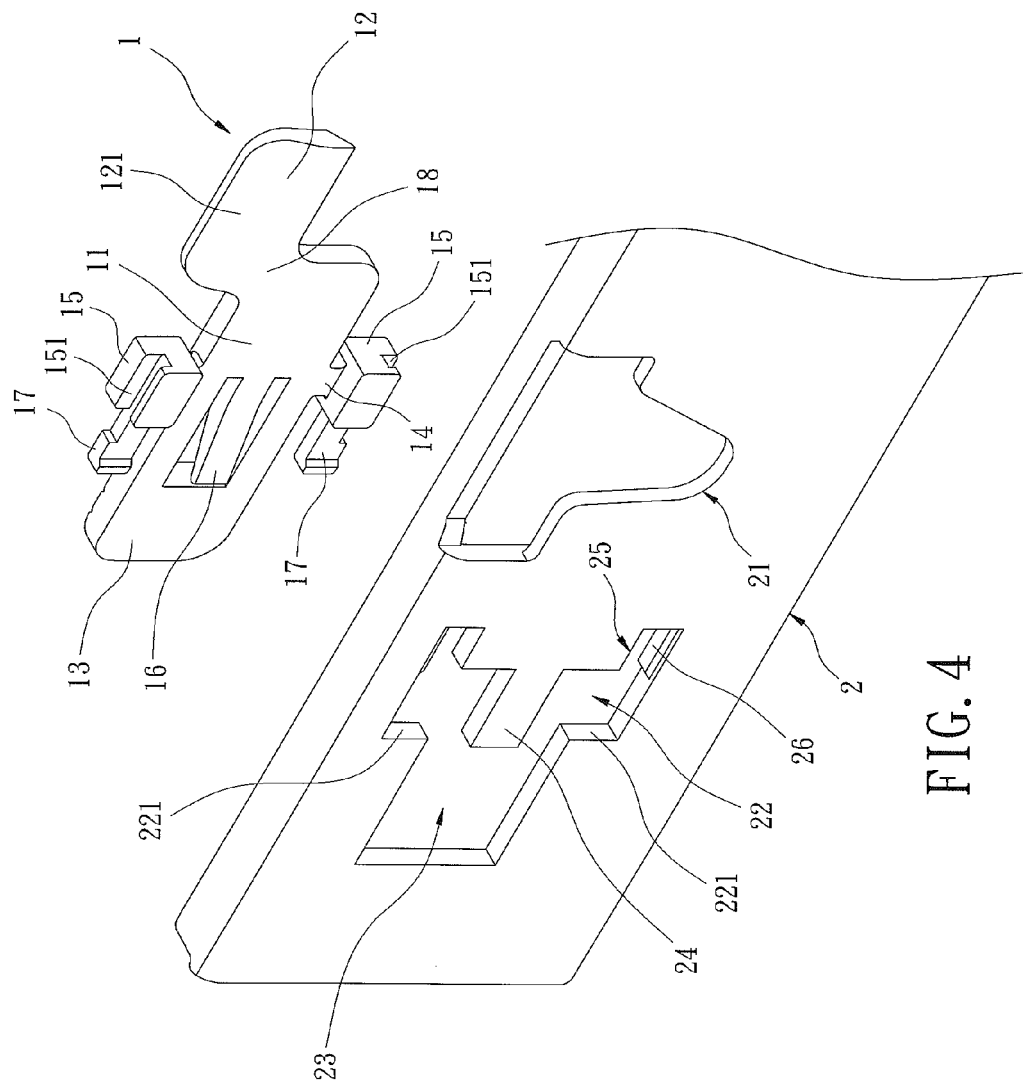
FIG. 4 is an exploded, perspective view of the slide track of FIG. 1.
Figure 5:
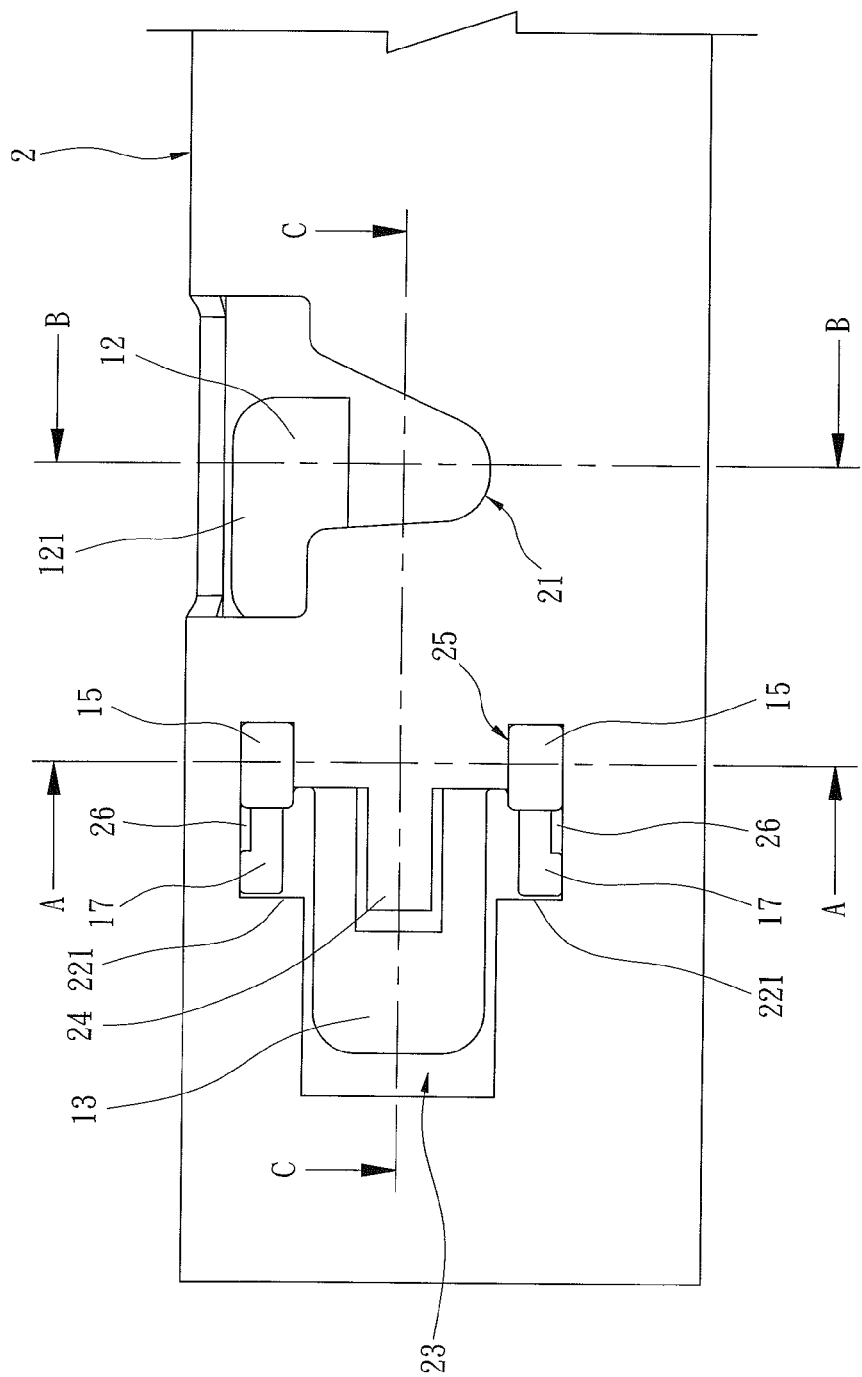
FIG. 5 is a side view of the slide track of FIG. 1.
Figure 6:
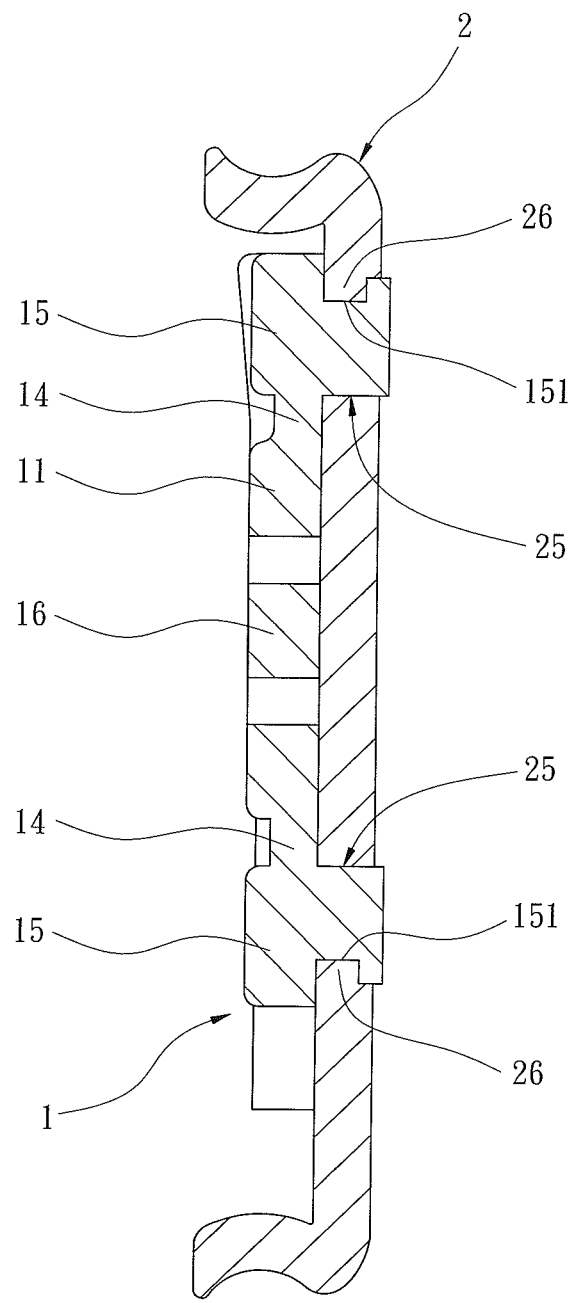
FIG. 6 is a cross sectional view taken along section line A-A of FIG. 5.
Figure 7:
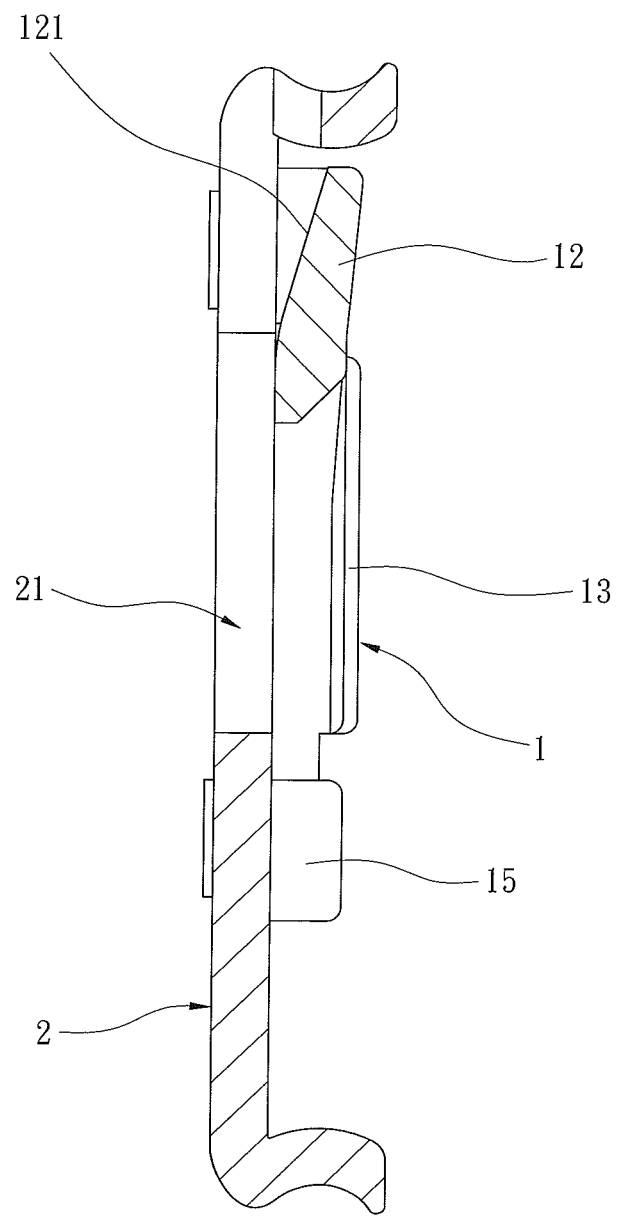
FIG. 7 is a cross sectional view taken along section line B-B of FIG. 5.
Figure 8:
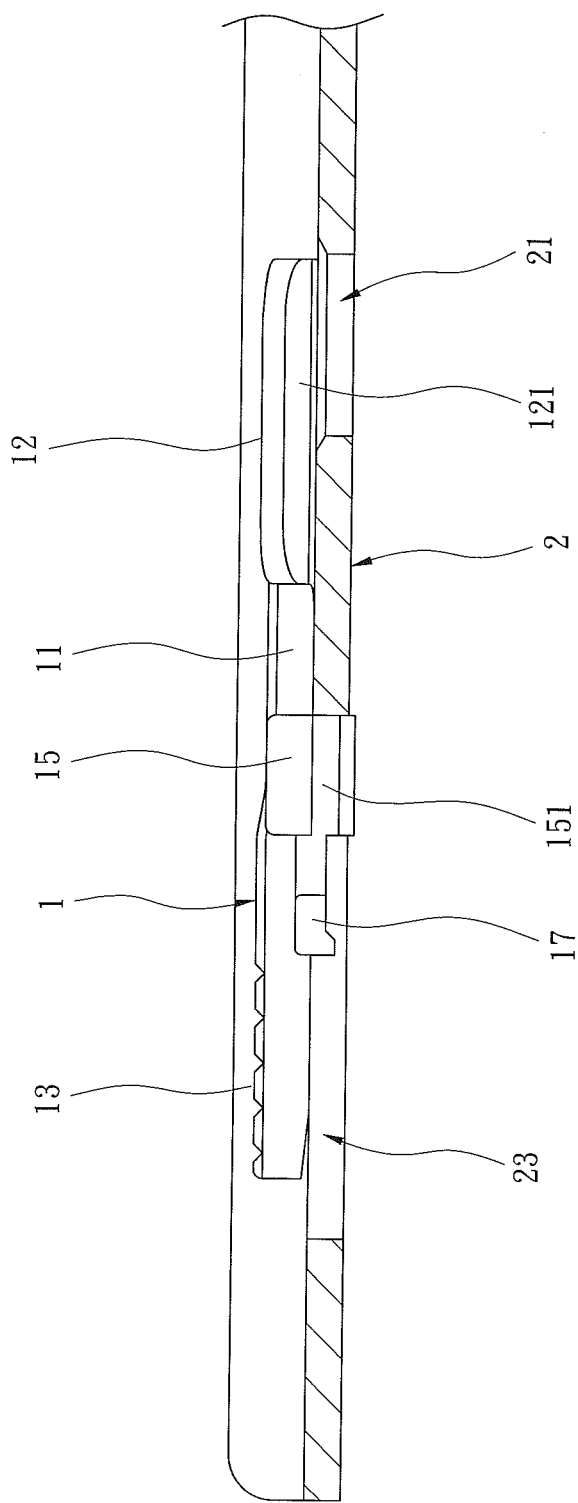
FIG. 8 is a cross sectional view taken along section line C-C of FIG. 5.

With reference to FIGS. 1-8, a slide track according to the present invention includes a positioning member 1 and an inner track 2.

The positioning member 1 is integrally formed of plastic material by injection molding. A positioning member 1 has a base 11. The positioning member 1 further includes a stop portion 12 and a pressing portion 13 respectively extending away from two opposite sides of the base 11. The base 11 includes two opposite faces between the stop portion 12 and the pressing portion 13. A connection portion 14 is formed on each of the two opposite faces of the base 11. A positioning portion 15 is connected to each connection portion 14. A stop 17 extends from a side of each positioning portion 15 of the positioning member 1. Each positioning portion 15 includes an outer face having a guiding groove 151. The base 11 of the positioning member 1 includes a slot having a side. A resilient arm 16 is non-rectilinear and extends from the side of the slot and has a distal end outside of the slot of the base 11 of the positioning member 1. The positioning member 1 further includes a bend 18 between the base 11 and the stop portion 12. The stop portion 12 of the positioning member 1 includes an inclined guiding face 121.

The inner track 2 includes a limiting groove 21 and two positioning holes 22 spaced from the limiting groove 21 in a longitudinal direction of the inner track 2. The two positioning holes 22 are spaced from each other in a direction perpendicular to the longitudinal direction. The inner track 2 further includes a pressing portion 24 between the two positioning holes 22. The inner track 2 further includes a hollow portion 23. The two positioning holes 22 are located between the limiting groove 21 and the hollow portion 23 in the longitudinal direction. Each positioning hole 22 includes a stop face 221 adjacent to the hollow portion 23. A restraining hole 25 is defined in a side of each of the two positioning holes 22 of the inner track 2 distant to the hollow portion 23. Each restraining hole 25 includes an inner wall having a limiting protrusion 26.

When mounting the positioning member 1 into the inner track 2, the resilient arm 16 firstly abuts the pressing portion 24, and each positioning portion 15 is aligned with one of the two positioning holes 22. The positioning member 1 is then pushed towards the inner track 2 to make each positioning portion 15 extend into one of the two positioning holes 22 of the inner track 2. Next, the positioning member 1 is moved towards the limiting groove 21 to move each positioning portion 15 towards one of the restraining holes 25. After each positioning portion 15 enters one of the restraining holes 25, each limiting protrusion 26 is received in one of the guiding grooves 151, and each stop 17 abuts against and is positioned by an inner wall of one of the two positioning holes 22. The pressing portion 13 of the positioning member 1 is aligned with the hollow portion 23 of the inner track 2. The stop portion 12 is aligned with the limiting groove 21 of the inner track 2, is located adjacent to an inner face of the inner track 2, and is located adjacent to an upper section of the limiting groove 21 of the inner track 2. Assemblage of the slide track according to the present invention is, thus, easily completed after snap-fitting. After assemblage, the stop portion 12 is located between the base 11 and an inner face of the inner track 2, and the inclined guiding face of the stop portion 12 of the positioning member 1 faces an inner face of the inner track 2.

Figure 9:
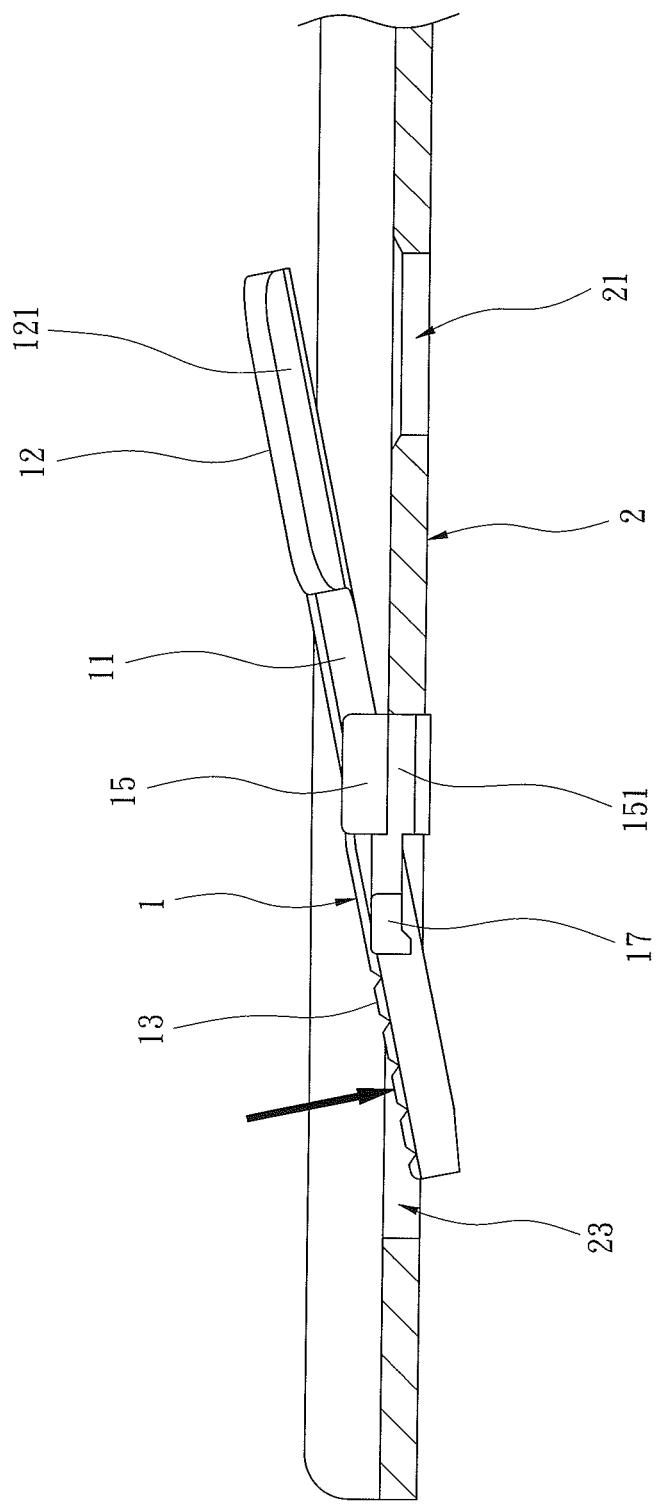
FIG. 9 is a view similar to FIG. 8, with a pressing portion of a positioning member of the slide track pressed.
Figure 10:
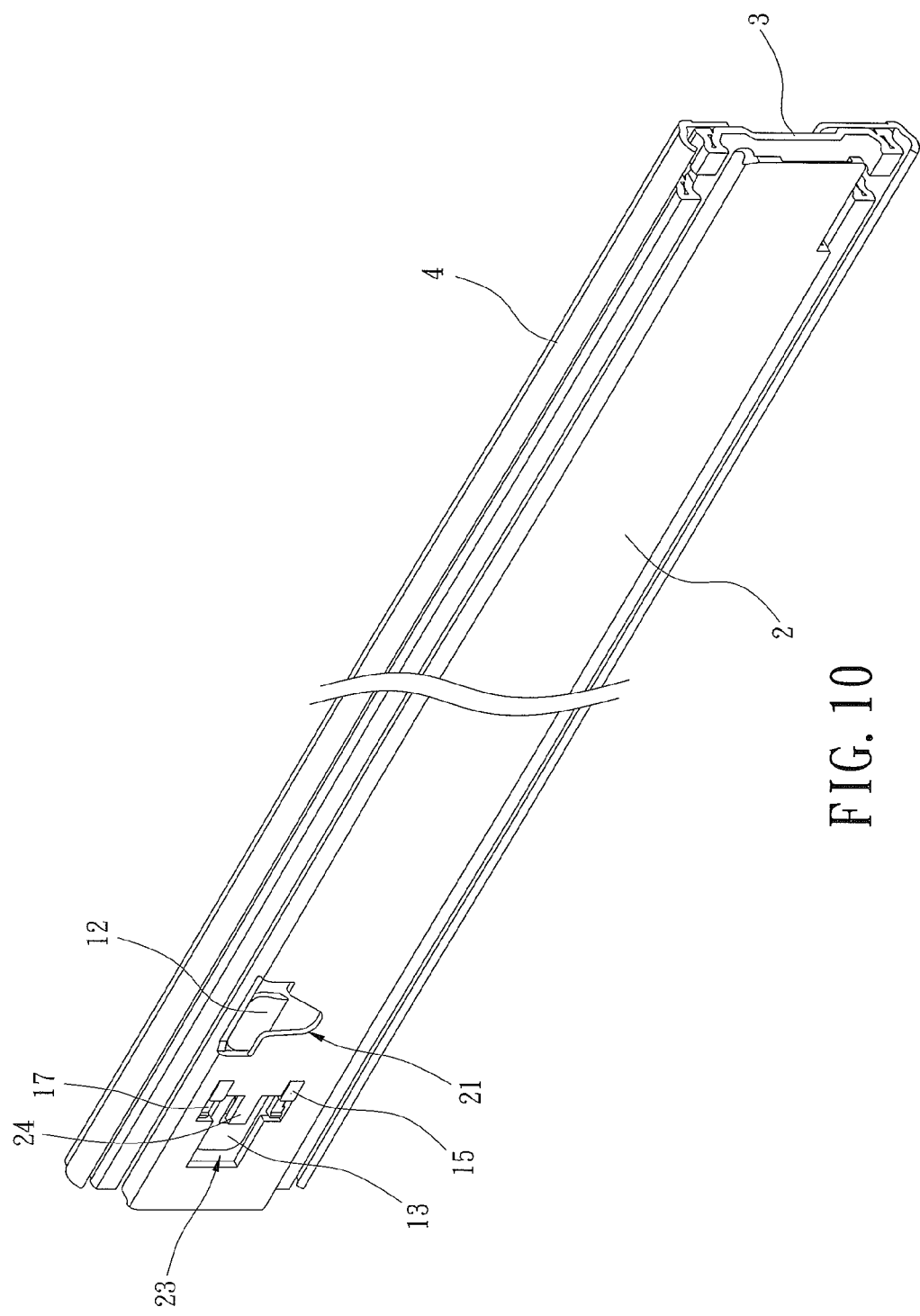
FIG. 10 is a perspective view illustrating use of the slide track with a middle track and an outer track.
Figure 11:
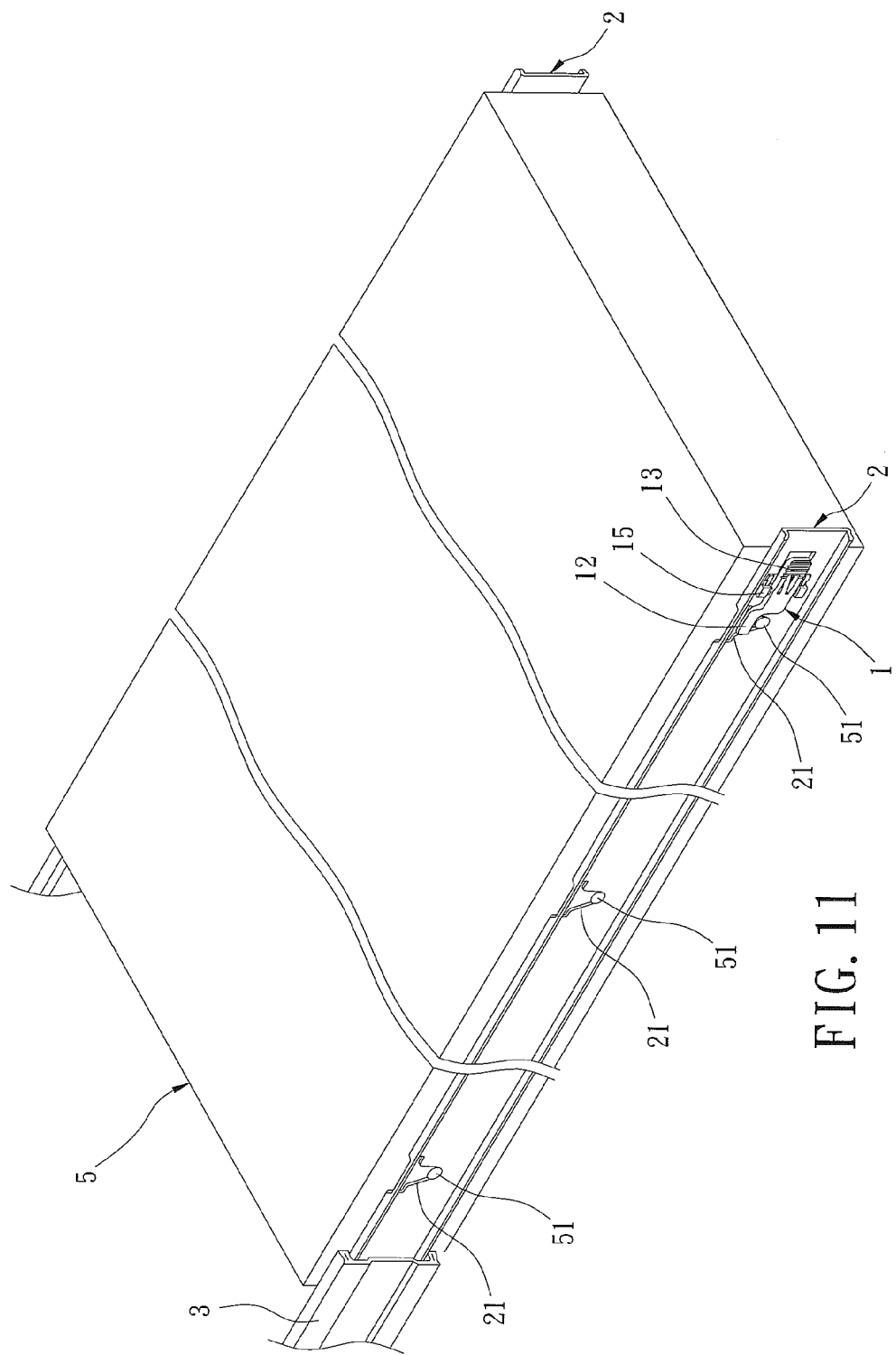
FIG. 11 is a perspective view illustrating use of the slide track with a server.
Figure 12:
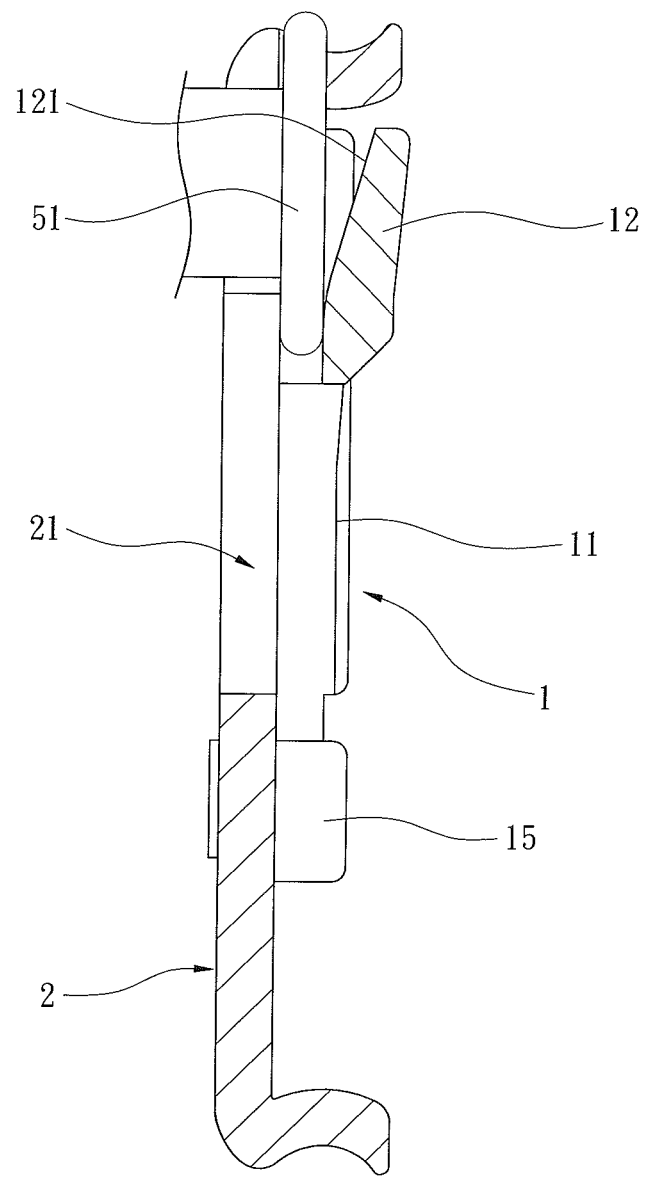
FIG. 12 is a cross sectional view illustrating a transient state of installation of the server to the inner track.
Figure 13:
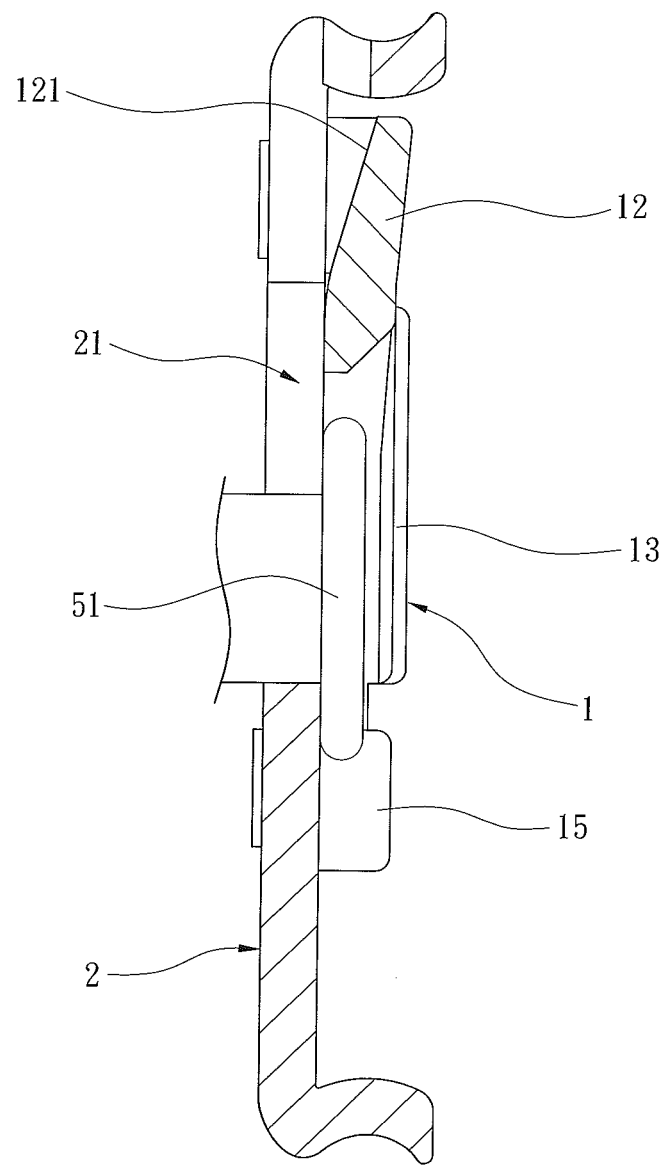
FIG. 13 is a view similar to FIG. 12, illustrating connection and positioning between the inner track and the server.

With reference to FIGS. 1 and 9, when a user presses the pressing portion 13 of the positioning member 1, the pressing portion 13 enters the hollow portion 23 of the inner track 2, such that the stop portion 12 and the pressing portion 13 of the positioning member 1 pivot about a pivot axis defined by the connection portions 14. Thus, the stop portion 12 moves away from the inner face of the inner track 2. The resilient arm 16 of the positioning member 1 presses against the pressing portion 24 of the inner track 2, providing a returning force when the pressing portion 13 is released, moving the pressing portion 13 out of the hollow portion 23 and moving the stop portion 12 towards the inner face of the inner track 2.

With reference to FIGS. 10-13, in use of the slide track according to the present invention, the inner track 2 is mounted in a middle track 3, which, in turn, is mounted in an outer track 4, permitting the inner track 2 and the outer track 3 to extend out of or retract into the outer track 4. When mounting a server 5 to the inner track 2, an engagement button 51 on a side of the server 5 enters the limiting groove 21 from above the limiting groove 21 of the inner track 2. While the engagement button 51 is moving into the limiting groove 21, the engagement button 51 pushes the stop portion 12 of the positioning member 1 and moves the stop portion 12 away from the inner face of the inner track 2. The inclined guiding face 121 of the stop portion 12 guides the engagement button 51 into the limiting groove 21. After the engagement button 51 has entered the limiting groove 21, the stop portion 12 returns to its initial position to prevent the engagement button 51 from moving upwards out of the limiting groove 21. Thus, the connection and positioning between the server 5 and the inner track 2 are completed.

With reference to FIGS. 1, 9. 11, and 13, when it is desired to disengage the server 5 from the inner track 2, the user presses the pressing portion 13 of the positioning member 1, such that the stop portion 12 and the pressing portion 13 of the positioning member 1 pivot about the pivot axis defined by the connection portions 14, moving the stop portion 12 away from the inner face of the inner track 2. Thus, the engagement button 51 of the server 5 can be moved upwards out of the limiting groove 21.

By the arrangement of engaging the positioning portions 15 of the positioning member 1 with the positioning holes 22 and the restraining holes 25 of the inner track 2, the assemblage procedure and disposition of the elements can be simplified to reduce the costs whole permitting easy repair and replacement. Furthermore, the positioning member 1 is integrally formed of plastic material by injection molding, further saving the costs.

Although specific embodiments have been illustrated and described, numerous modifications and variations are still possible without departing from the scope of the invention. The scope of the invention is limited by the accompanying claims.

The invention claimed is:

1. A slide track comprising:
an inner track including a limiting groove and two positioning holes spaced from the limiting groove in a longitudinal direction of the inner track, with the two positioning holes spaced from each other in a direction perpendicular to the longitudinal direction, with the inner track further including a hollow portion, and with the two positioning holes located between the limiting groove and the hollow portion in the longitudinal direction; and
a positioning member having a base, with the positioning member further including a stop portion and a pressing portion respectively extending away from two opposite sides of the base, with the base further including two opposite faces between the stop portion and the pressing portion, with a connection portion formed on each of the two opposite faces of the base, with a positioning portion connected to each connection portion, with each positioning portion positioned in one of the two positioning holes of the inner track, with the pressing portion aligned with the hollow portion of the inner track, and with the stop portion aligned with the limiting groove of the inner track.

2. The slide track as claimed in claim 1, with the base of the positioning member including a slot having a side, with a resilient arm extending from the side of the slot and having a distal end outside of the slot of the base of the positioning member, with the inner track further including a pressing portion between the two positioning holes, and with the resilient arm abutting the pressing portion.

3. The slide track as claimed in claim 1, with a restraining hole defined in a side of each of the two positioning holes of the inner track distant to the hollow portion, with each restraining hole including an inner wall having a limiting protrusion, with a stop extending from a side of each positioning portion of the positioning member, with each positioning portion including an outer face having a guiding groove, with each positioning portion extending into one of the two positioning holes of the inner track and moving towards one of the restraining holes when the positioning member is being mounted to the inner track, wherein after each positioning portion enters one of the restraining holes, each limiting protrusion is received in one of the guiding grooves, and each stop abuts against and is positioned by an inner wall of one of the two positioning holes.

4. The slide track as claimed in claim 1, wherein the positioning member further includes a bend between the base and the stop portion, and wherein the stop portion is located between the base and an inner face of the inner track.

5. The slide track as claimed in claim 1, wherein the stop portion of the positioning member further includes an inclined guiding face facing an inner face of the inner track.

6. The slide track as claimed in claim 1, wherein the positioning member is integrally formed of plastic material by injection molding.

\* \* \* \* \*